United States Patent [19]

Shimawaki

[11] Patent Number: 4,902,643
[45] Date of Patent: Feb. 20, 1990

[54] METHOD OF SELECTIVE EPITAXIAL GROWTH FOR COMPOUND SEMICONDUCTORS

[75] Inventor: Hidenori Shimawaki, Tokyo, Japan

[73] Assignee: NEC Corporation, Tokyo, Japan

[21] Appl. No.: 308,027

[22] Filed: Feb. 9, 1989

[30] Foreign Application Priority Data

Feb. 9, 1988 [JP] Japan .................................. 63-29472

[51] Int. Cl.⁴ .............................................. H01L 21/20
[52] U.S. Cl. ............................... 437/89; 148/DIG. 26; 148/DIG. 106; 156/613; 437/81; 437/90; 437/110; 437/132; 437/912; 437/945; 437/962
[58] Field of Search ................... 148/DIG. 26, 56, 59, 148/65, 64, 106, 110, 169; 156/610–615; 427/248.1, 252; 437/81, 89, 90, 110, 108, 126, 132, 133, 912, 945, 962

[56] References Cited

U.S. PATENT DOCUMENTS

| | | | |
|---|---|---|---|
| 4,066,482 | 1/1978 | Shaw .................................. | 437/133 |
| 4,114,257 | 9/1978 | Bellavance .......................... | 437/133 |
| 4,171,234 | 10/1979 | Nagata et al. ....................... | 437/133 |
| 4,426,767 | 1/1984 | Swanson et al. ...................... | 437/90 |
| 4,448,797 | 5/1984 | Burnham ............................. | 156/613 |
| 4,826,784 | 5/1989 | Salerno et al. ....................... | 437/89 |

FOREIGN PATENT DOCUMENTS 0265814 5/1985 Japan .
0284913 12/1986 Japan .

OTHER PUBLICATIONS

Tu et al., "Selective-Area Epitaxy of GaAs ... ", Molecular Beam Epitaxy, Fifth International Conference, Tokyo, Japan 1988, pp. 175-176.
Yamaguchi et al., "Selective Epitaxial Growth of Gallium Arsenide", Jpn. J. Appl. Phys., Part 1, 24(12), 1985, pp. 1666-1671.

Primary Examiner—Olik Chaudhuri
Assistant Examiner—William Bunch
Attorney, Agent, or Firm—Burns, Doane, Swecker & Mathis

[57] ABSTRACT

A method of selective epitaxial growth for compound semiconductor includes the steps of forming a layer of group IV element semiconductor, such as Ge, with a predetermined pattern on a compound semiconductor substrate and forming a compound semiconductor layer selectively on the compound semiconductor substrate by alternately supplying a gas of compound containing a group III or II element, such as trimethylgallium, triethylgallium and triisobutylaluminum, and a gas of compound containing a group V or VI element, such as $AsH_3$, onto both surface of the layer of group IV element semiconductor and the compound semiconductor substrate. Another semiconductor layer of group IV element semiconductor or compound semiconductor may be formed on the layer of group IV element semiconductor by organometallic vapor phase epitaxy or MBE.

12 Claims, 4 Drawing Sheets

METHOD OF SELECTIVE EPITAXIAL GROWTH FOR COMPOUND SEMICONDUCTORS

BACKGROUND OF THE INVENTION

1. Field of the Invention:

The present invention relates to a method of manufacturing a compound semiconductor device and more particularly, to a method of selective epitaxial growth of compound semiconductors.

2. Description of the Related Art:

Compound semiconductors have large electron mobility, light-emitting function and new physical phenomena ascribe to their characteristic energy band structures, which constitute the characteristics thereof, and which are not seen in a group IV semiconductor element, such as silicon and germanium. Therefore, a compound semiconductor has attracted many attentions as a material for an ultrahigh-speed computing device, an ultrahigh-frequency oscillating device and an optoelectronic device. In recent years, especially, a bipolar transistor and a field-effect transistor utilizing hetero-junction have been actively studied.

A compound semiconductor layer has heretofore been grown for manufacturing these devices by a method of molecular beam epitaxy (MBE) or a method of organometallic vapor phase epitaxy. However, in MBE and organometallic vapor phase epitaxy, it is difficult to set large a ratio of a growth rate on a semiconductor layer to than on a $SiO_2$ film or a $SiN_x$ film used as a mask, and thus selective growth of a compound semiconductor is difficult.

In MBE, selective epitaxial growth is very difficult as desclosed in "Journal of Applied Physics", Vol. 40, No. 2, 1975, pages 783–785. Selective growth in organometallic vapor phase epitaxy is disclosed in "Journal of Crystal Growth", Vol. 55, 1981, pages 229–234, "Applied Physics Letters", Vol. 45, No. 11, 1984, pages 1229–1231, and "Journal of Crystal Growth", Vol. 73, 1985, pages 73–76. However, the conditions enabling the selective growth is strictly limited, and the selectivity is not sufficiently high for manufacturing semiconductor devices. Therefore, it is very difficult in MBE and organometallic vapor phase epitaxy to form regions, the composition and impurity concentration of which are different in a plane parallel to a substrate surface.

These problems can be solved to a certain extent by an additional method, i.e., by carrying out selective etching, or selective doping using ion implantation. However, these additional methods are not satisfactorily effective for miniaturized devices and have problems peculiar thereto. For example, dry etching causes damage to a semiconductor surface, and wet etching has a poor working accuracy. Ion implantation causes radiation damage to a semiconductor surface and redistribution of impurities therein during an annealing step.

SUMMARY OF THE INVENTION

It is, therefore, an object of the present invention to provide a method of selective epitaxial growth for compound semiconductors with high selectivity.

The selective growth method for compound semiconductor devices according to the present invention has the steps of forming a layer of group IV element semiconductor with a predetermined pattern on a compound semiconductor substrate, and growing a compound semiconductor selectively on the compound semiconductor substrate by alternately supplying a gas of a compound containing an element in group III or II and a gas of a compound containing an element in group V or VI to the surface of the substrate.

By alternately supplying a gas of a compound containing an element in group III or II and a gas of a compound containing an element in group V or VI onto the surface of a compound semiconductor substrate, a compound semiconductor can be epitaxially grown by utilizing an adsorption reaction. This method is called Atomic Layer Epitaxy (ALE) and disclosed in "Extended Abstracts of the 16th (1984 International) Conference on Solid State Devices and Materials", Kobe, 1984, pages 647–650, "Journal of Electrochemical Society", Vol. 132, No. 5, 1985, pages 1197–1200, and "Japanese Journal of Applied Physics", Vol. 25, No. 3, 1986, pages L212–L214.

In the compound semiconductors, such as GaAs and InP, atoms are ionically bonded, while, in the group IV element semiconductors, such as Si and Ge, atoms are bonded by nonpolar covalent bonds. In growing a compound semiconductor by a crystal growth method such as ALE in which an adsorption reaction is used, a growth rate ratio can be set large, since the adsorbability of reaction molecules on a compound semiconductor and that on a group IV element semiconductor are very different. Therefore, the inventor of the present invention thought that it was possible to grow a compound semiconductor layer selectively on a compound semiconductor by using a layer of group IV element semiconductor as a mask. In this case, a compound semiconductor constituting the substrate and a compound semiconductor to be subjected to crystal growth may not necessarily consist of the same semiconductor material, and a hetero-junction may be formed by growing a compound semiconductor on a compound semiconductor substrate of different kind. The compound semiconductors to be used in the present invention are not limited to III-V compound semiconductors, and II-VI compound semiconductors may also be used.

On the other hand, germanium of group IV element semiconductor, has a diamond lattice structure, while GaAs of a III-V compound semiconductor has a zinc-blende lattice structure. However, both belong to the tetrahedral phases and the lattice mismatch is as small as 0.1%. Accordingly, it is possible not only to both epitaxially grow a Ge layer of good crystallinity on GaAs, but also to epitaxially grow a GaAs layer of good crystallinity on Ge by MBE or organometallic vapor phase epitaxy. AlAs and AlGaAs also have very small lattice mismatchs of lower than 0.3% to Ge, and epitaxial growth similar to GaAs can be attained.

Consequently, if Ge is used as a mask for selective growth of, for example, GaAs by ALE, it becomes possible in the following steps to epitaxially grow GaAs, AlGaAs and AlAs of good crystallinity on the mask of Ge by a crystal growth method with small selection ratio, such as MBE and organometallic vapor phase epitaxy.

Combinations of a compound semiconductor and a group IV element semiconductor are not necessarily limited to the combinations of GaAs, AlGaAs, or AlAs on Ge. Other combinations can also serve the purpose if a compound semiconductor having a small lattice mismatch to a group IV element semiconductor are used. A semiconductor to be epitaxially grown on a group IV element semiconductor which is used as a mask may consist of not only a compound semiconductor but also a group IV element semiconductor which is the same as or different from the mask-forming group IV element semiconductor.

According to the present invention, since the growth of a compound semiconductor is carried out by using an adsorption reaction with a group IV element semiconductor used as a mask, a compound semiconductor layer can be formed selectively on a compound semiconductor layer. Additionally a high quality monocrystalline semiconductor layer can be epitaxially grown on the mask of a group IV element semiconductor by organometallic vapor phase epitaxy or MBE. Therefore, a semiconductor device having a buried layer can be manufactured easily. Moreover, degree of freedom to device structures becomes large. Furthermore, a compound semiconductor device of high-speed nd high-frequency characteristics can be obtained with the device structure miniaturized.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS (First Embodiment)

Figure 1:
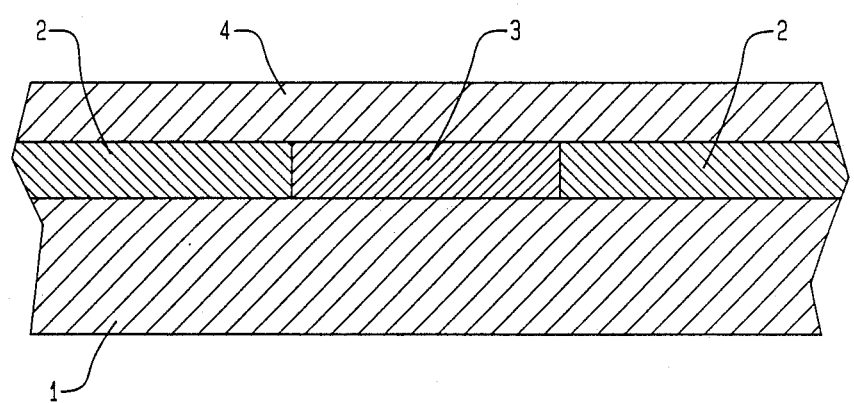
FIG. 1 is a sectional view for explaining a first embodiment of the present invention.

Referring now to FIG. 1, a semiconductor layer 2 of undoped Ge is formed by MBE on a semi-insulating (100) GaAs substrate 1. The semiconductor layer 2 is grown by 1500 Å with the temperature of the substrate kept at 300° C. A photoresist film of a predetermined pattern is then formed on the semiconductor layer 2. The semiconductor layer 2 is selectively removed by reactive ion beam etching using $CF_4$, so as to expose the surface of the semi-insulating substrate 1.

Next, the photoresist film is removed by an organic solvent. Then, a semiconductor layer 3 of p-GaAs is selectively formed by ALE to a thickness of 1500 Å on the portion of the surface of the semi-insulating substrate 1 exposed from the semiconductor layer 2 used as a mask, resulting in that the surface of the semiconductor layer 3 becomes flush with that of the semiconductor layer 2. ALE is carried out by alternately supplying trimethylgallium (TMG) and $AsH_3$ under vacuum onto the substrate 1. During the growth, the temperature of the substrate 1 is kept at 500° C. TMG and $AsH_3$ are supplied at $3 \times 10^{-5}$ Torr for 3 sec, and at $3 \times 10^{-4}$ Torr for 18 sec, respectively, with evacuation of 1 second being carried out after supplying each of these starting gases. Under such growth conditions, the GaAs layer 3 is formed selectively only on the semi-insulating GaAs substrate 1. The growth rate in this case is about one molecular layer (2.83 Å) per cycle (22 sec), and the GaAs layer 3 has a carrier concentration of C (carbon) doped $p = 10^{18} - 10^{20}$ cm$^{-3}$. In the case where TMG and $AsH_3$ are used as starting gases, selective growth as described above can be effected when the substrate temperature is not higher than 550° C.

An n-Al$_x$Ga1-xAs layer 4 is then formed on the semiconductor layers 2, 3 by MBE with the substrate temperature at 650° C. The component ratio x of Al, carrier concentration and thickness of the semiconductor layer 4 are set to 0.3, Si doped $n = 3 \times 10^{17}$ cm$^{-3}$ and 2000 Å, respectively.

In this embodiment, a layer of GaAs of a compound semiconductor is formed selectively on the compound semiconductor substrate 1 with Ge of a group IV element semiconductor used as a mask, and a high-quality single crystalline AlGaAs layer 4 is epitaxially grown in a later step both on the Ge layer 2 used as a mask and on the GaAs layer 3.

(Second Embodiment)

Figure 2A:
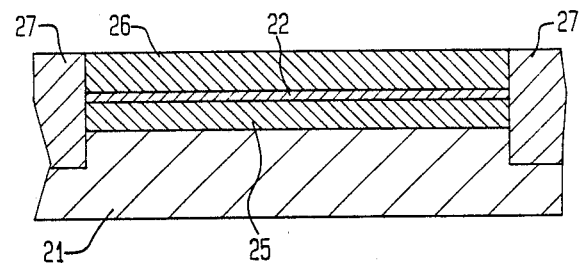
FIGS. 2(a) to 2(f) are sectional views for explaining a second embodiment of the present invention.

In this embodiment, the present invention is applied to the manufacturing of bipolar transistors. First, as shown in FIG. 2(a), a semiconductor layer 25 of n-GaAs, a semiconductor layer 22 of undoped Ge and a semiconductor layer 26 of p-Ge are formed in this order by MBE on a surface of a semi-insulating (100) GaAs substrate 21.

The n-GaAs layer 25 is formed at a substrate temperature of 650° C., and the carrier concentration and thickness of the grown layer 25 are set to be Si doped $n = 3 \times 10^{18}$ cm$^{-3}$ and 5000 Å, respectively. The semiconductor layers 22 and 26 are formed at a substrate temperature of 300° C. with the thicknesses of 1000 Å and 2200 Å, respectively. The carrier concentration of the semiconductor layer 26 is set to be Ga doped $p = 1 \times 10^{20}$ cm$^{-3}$.

The hydrogen ion H+ is then implanted into the surface except the portion thereof on which a bipolar transistor is to be formed, to form an insulated region 27. The accelerating energy and dose during the ion implanting are set to be 200 KeV and $3 \times 10^{15}$ cm$^{-2}$, respectively.

Figure 2B:
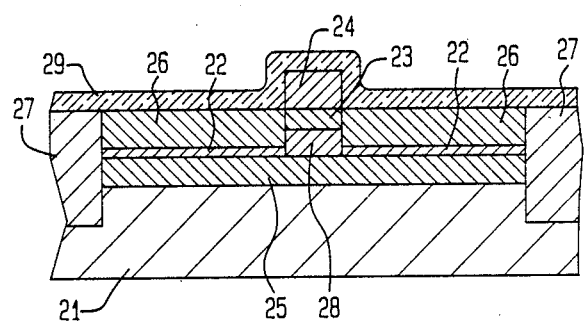

As shown in FIG. 2(b), a photoresist film having a predetermined pattern is formed, and the semiconductor layers 26 and 22 are then selectively removed by reactive ion beam etching using $CF_4$ with the photoresist film used as a mask, to expose the surface of the semiconductor layer 25. After the photoresist film has been removed, a semiconductor layer 28 of n-GaAs, a semiconductor layer 23 of p-GaAs, and a semiconductor layer 24 of n-AlGaAs are formed selectively in this order by ALE on the semiconductor layer 25 with the semiconductor layers 26 and 22 used as masks.

ALE is carried out by using triethylgallium (TEG), triisobutylaluminum (TIBA) and $AsH_3$. The semiconductor layer 28 is formed by alternately supplying TEG and $AsH_3$ at a substrate temperature of 300° C. Supply pressures of TEG and $AsH_3$ are $3 \times 10^{-6}$ Torr and $3 \times 10^{-4}$ Torr, respectively. While TEG is supplied, $Si_2H_6$ is fed at $5 \times 10^{-7}$ Torr simultaneously to dope the growing layer with Si. The thickness and carrier concentration of the semiconductor layer 28 are set to 2500 Å and $n = 1 \times 10^{17}$ cm$^{-3}$, respectively.

The semiconductor layer 23 is formed by alternately introducing TMG and $AsH_3$ at $3 \times 10^{-5}$ Torr and $3 \times 10^{-4}$ Torr, respectively, at a substrate temperature of 500° C. The thickness and carrier concentration thereof are set to 700 Å and $p = 2 \times 10^{19}$ cm$^{-3}$, respectively.

The semiconductor layer 24 is formed by supplying in turn TIBA of $3 \times 10^{-5}$ Torr (for 2 sec), TEG of $3 \times 10^{-6}$ Torr (for 2 sec) and $AsH_3$ of $3 \times 10^{-4}$ Torr (for 15 sec) at a substrate temperature of 300° C. with 1 sec evacuating operations carried out between each gas supplying operation. While TEG is supplied, $Si_2H_6$ of $1 \times 10^{-6}$ Torr is fed simultaneously to dope the growing layer with Si. The Al component ratio x, thickness and carrier concentration of the $Al_xGa_{1-x}As$ semiconductor layer 24 are set to 0.3, 2500 Å and $3 \times 10^{17}$ cm$^{-3}$, respectively.

The selective growth described above is possible at a substrate temperature of not higher than 350° C. A $SiO_2$ film 29 is then formed to a thickness of 1500 Å on the whole surface with a substrate temperature of 370° C.

Figure 2C:
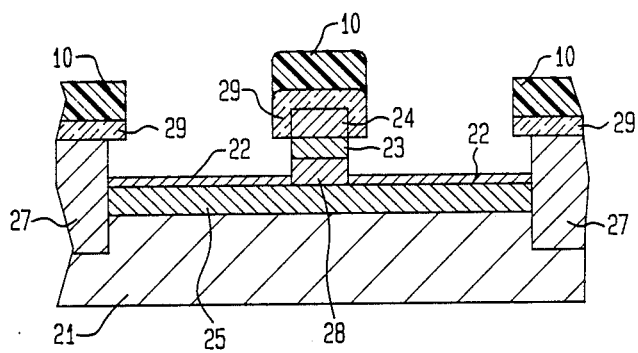

As shown in FIG. 2(c), a photoresist film 10 of a predetermined pattern is then formed. Next, the $SiO_2$ film 29 is selectively removed by reactive ion etching using $CF_4$ with this film 10 used as a mask, to form side walls of the $SiO_2$ film 29 on the side surfaces of the semiconductor layer 24. The semiconductor layer 26 is then etched with a solution consisting of ammonia, hydrogen peroxide and water to expose the surface of the semiconductor layer 22.

Figure 2D:
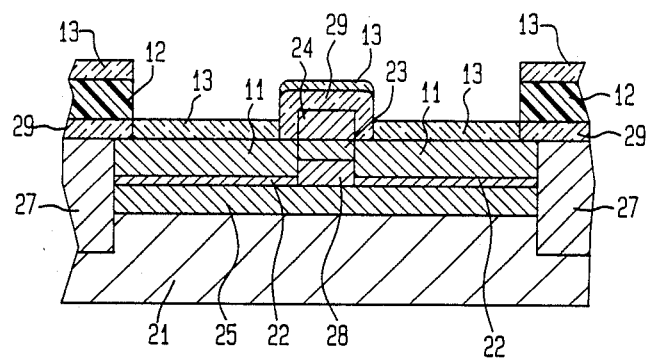

As shown in FIG. 2(d), the resultant product is washed with an organic solvent to remove the photoresist film 10. Then a semiconductor layer 11 of p-GaAs is selectively grown on the semiconductor layer 22 by low pressure organometallic vapor phase epitaxy with the $SiO_2$ film 29 used as a mask. TMG and $AsH_3$ are used as starting gases, and a substrate temperature is set to be at 650° C. The pressure and molar ratio of $AsH_3$ to TMG during the growth of the semiconductor layer are set to 10 Torr and 50, respectively. The semiconductor layer 11 having a carrier concentration of Zn doped $p=5 \times 10^{18}$ cm$^{-3}$ is grown selectively to a thickness of 2200 Å with dimethylzinc used as a doping gas.

A photoresist film 12 is then formed on the $SiO_2$ film 29 on the insulating region 27, and a layer 13 of AuZnNi, the ohmic metals for the semiconductor layer 11, is formed by evaporation.

Figure 2E:
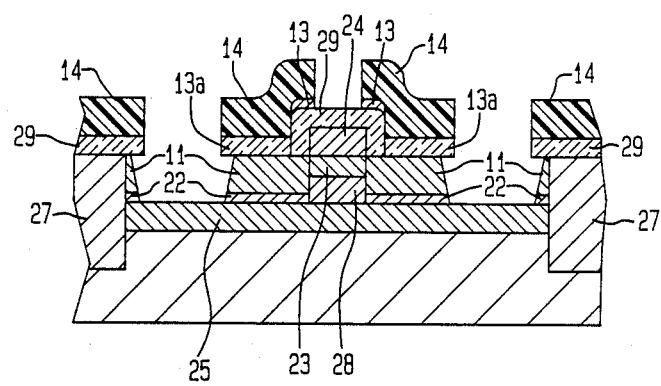

As shown in FIG. 2(e) the resultant product is then washed with an organic solvent to remove the photoresist film 12. Next, a photoresist film 14 of a predetermined pattern for forming emitter and collector electrodes is formed. The AuZnNi layer 13 is then selectively removed by an ion milling etching using Ar$^+$. The semiconductor layer 11 is then etched with a solution consisting of phosphoric acid, hydrogen peroxide and water, and thereafter the semiconductor layer 2 is selectively removed with a solution consisting of ammonia, hydrogen peroxide and water to expose the semiconductor layer 25.

Figure 2F:
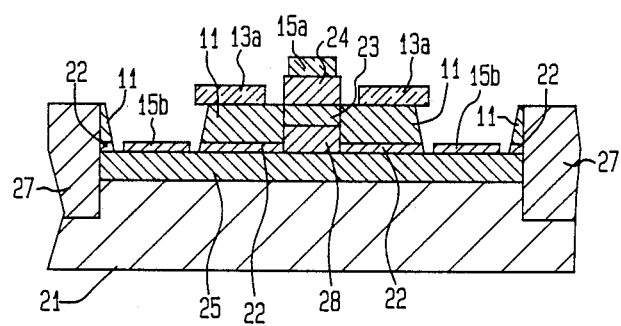

As shown in FIG. 2(f), the $SiO_2$ film 29 on the semiconductor layer 24 is then etched with buffer solution hydrofluoric acid. Next, a layer 15 of AuGeNi, which is the ohmic metal for the semiconductor layers 24, 25, is formed by evaporation. During this step, an emitter electrode 15a and a collector electrode 15b are formed on the surfaces of the semiconductor layers 24 and 25, respectively, in a self-aligned manner with respect to the base electrode 13a. The AuGeNi layer 15 is then lifted off by removing the photoresist layer 14, and the $SiO_2$ film 29 is etched away with buffer solution of hydrofluoric acid, to obtain a bipolar transistor of a compound semiconductor.

In the bipolar transistor manufactured in this embodiment, the resistance in a base leading-out region is reduced, and the parasitic capacitance between the external base and collector is lowered owing to the effect of the buried layer 22 of the undoped Ge, resulting in the improvement in high-speed and high-frequency characteristics.

(Third Embodiment)

Figure 3A:
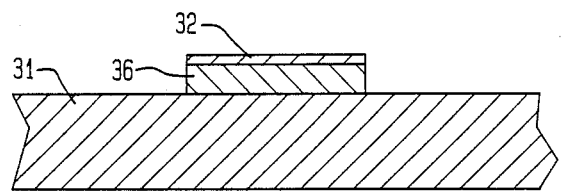
FIGS. 3(a) to 3(c) are sectional views for explaining a third embodiment of the present invention.

In this embodiment, the present invention is applied to the manufacturing of a field-effect transistor. First, as shown in FIG. 3(a), a semiconductor layer 36 of a predetermined pattern consisting of p-Ge and a semiconductor layer 32 consisting of undoped Ge are formed on the surface of a semi-insulating (100) GaAs substrate 31 by MBE in the same manner as in the first embodiment. The thicknesses of the semiconductor layers 36, 32 are set to be 700 Å and 400 Å, respectively, and the carrier concentration of the semiconductor layer 36 to be Ga doped $p=5 \times 10^{17}$ cm$^{-3}$.

Figure 3B:
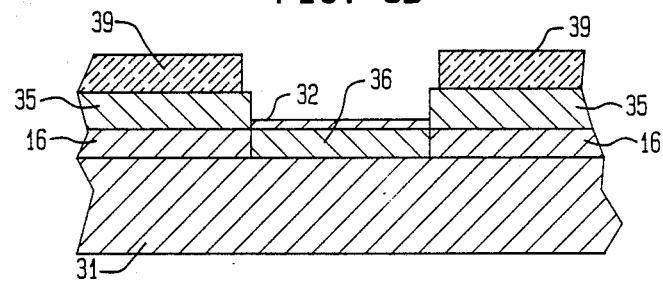

A semiconductor layer 16 consisting of undoped GaAs and a semiconductor layer 35 consisting of n-GaAs are then selectively formed by ALE on the semi-insulating substrate 31 with the semiconductor layer 32 and 36 used as masks, as shown in FIG. 3(b).

ALE is carried out in the same manner as in the above-described first embodiment, with TEG and $AsH_3$ used as starting gases and $Si_2H_6$ as a doping gas at a substrate temperature of 300° C. The thicknesses of the semiconductor layers 16, 35 are set to 700 Å and 1300 Å, respectively, and the carrier concentration of the semiconductor layer 35 to be Si doped $n=3 \times 10^{18}$ cm$^{-3}$. A $SiO_2$ film 39 with a predetermined pattern having a thickness of 2000 Å is then formed on the semiconductor layer 35.

Figure 3C:
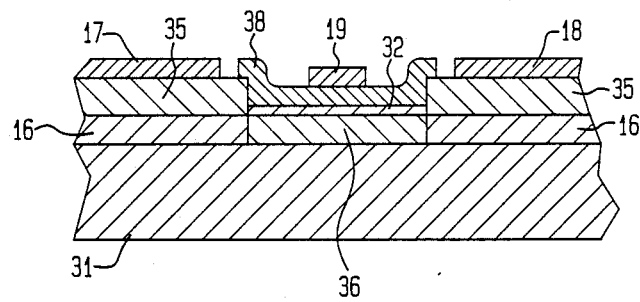

As shown in FIG. 3(c), a semiconductor layer 38 of n-GaAs is selectively formed by low pressure organometallic vapor phase epitaxy on the semiconductor layer 32 and on the end portion of the adjacent semiconductor layer 35 with the $SiO_2$ film 39 used as a mask. The substrate temperature is set to be at 650° C., and $Si_2H_6$ is used as a doping gas. The carrier concentration and the thickness of the film are set to be Si doped $n=5 \times 10^{17}$ cm$^{-3}$ and 700 Å, respectively. The $SiO_2$ film 39 is then removed by etching with buffer solution of hydrofluoric acid. A source electrode 17 and a drain electrode 18 are formed on the semiconductor layer 35, and a gate electrode 19 on the semiconductor layer 38 to obtain a field-effect transistor of a compound semiconductor.

In the field-effect transistor in this embodiment, short channel effect is suppressed due to the buried layer 36 of p-Ge, and the parasitic resistance is reduced since the gate has a recessed structure, resulting in small variation of the threshold voltage and the improvement in the high-speed and high-frequency characteristics.

In the above-described embodiments, the present invention is applied to the manufacturing of a bipolar transistor and a field-effect transistor. However, the present invention is not limited to these embodiments. The present invention can also be applied to the manufacturing of bipolar transistors and field effect transistors of other structures, and other types of compound semiconductor devices.

What is claimed is:

1. A method of selective epitaxial growth comprising the steps of:
   forming a layer of group IV element semiconductor with a predetermined pattern on a compound semiconductor substrate; and
   forming a compound semiconductor layer selectively on said compound semiconductor substrate by alternately supplying a first gas of a first compound containing a group III or II element and a second gas of a second gas of a second compound containing a group V or VI element onto both surfaces of said layer of group IV element semiconductor and said compound semiconductor substrate.

2. A method of selective epitaxial growth as claimed in claim 1, further comprising a step of forming another semiconductor layer on said layer of group IV element semiconductor after said step of forming said compound semiconductor layer.

3. A method of selective epitaxial growth as claimed in claim 1, wherein said compound semiconductor layer is a III-V compound semiconductor layer.

4. A method of selective epitaxial growth as claimed in claim 1, wherein said compound semiconductor layer is a II-VI compound semiconductor layer.

5. A method of selective epitaxial growth as claimed in claim 1, wherein compound semiconductor of said compound semiconductor layer is the same material as that of said compound semiconductor substrate.

6. A method of selective epitaxial growth as claimed in claim 1, wherein compound semiconductor of said compound semiconductor layer is different from that of said compound semiconductor substrate.

7. A method of selective epitaxial growth as claimed in claim 3, wherein said III-V compound semiconductor is selected from a group of GaAs, AlGaAs and AlAs, said group IV element semiconductor being Ge.

8. A method of selective epitaxial growth as claimed in claim 3, wherein said III-V compound semiconductor is GaAs, said group IV element semiconductor being Ge, said first gas being trimethylgallium or triethylgallium and said second gas being $AsH_3$.

9. A method of selective epitaxial growth as claimed in claim 3, wherein said III-V compound semiconductor is AlGaAs, said group IV element semiconductor being Ge, said first gas being triethylgallium and triisobutylaluminum and said second gas being $AsH_3$.

10. A method of selective epitaxial growth as claimed in claim 2, wherein said another semiconductor layer is a compound semiconductor layer.

11. A method of selective epitaxial growth as claimed in claim 2, wherein said another semiconductor layer is a layer of group IV element semiconductor.

12. A method of selective epitaxial growth as claimed in claim 2, wherein said another semiconductor layer is formed by a method of organometallic vapor phase epitaxy or a method of molecular beam epitaxy.

* * * * *